(12) United States Patent
Kim (10) Patent No.: US 9,159,444 B2
(45) Date of Patent: Oct. 13, 2015

(54) SEMICONDUCTOR DEVICE AND METHOD FOR DRIVING THE SAME

(71) Applicant: SK hynix Inc., Gyeonggi-do (KR)

(72) Inventor: Yeon-Uk Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/285,035

(22) Filed: May 22, 2014

(65) Prior Publication Data

US 2015/0162094 A1    Jun. 11, 2015

(30) Foreign Application Priority Data

Dec. 10, 2013    (KR) .................. 10-2013-0153173

(51) Int. Cl.
*G11C 17/00* (2006.01)
*G11C 17/16* (2006.01)

(52) U.S. Cl.
CPC ...................................... *G11C 17/16* (2013.01)

(58) Field of Classification Search
USPC .................................. 365/96, 189.09, 230.03
See application file for complete search history.

(56) References Cited

U.S. PATENT DOCUMENTS

2002/0054529 A1*    5/2002    Nishino et al. ................. 365/219

FOREIGN PATENT DOCUMENTS

KR    1020120052454    5/2012

* cited by examiner

*Primary Examiner* — Vu Le
(74) *Attorney, Agent, or Firm* — IP & T Group LLP

(57) ABSTRACT

A semiconductor device includes at least one first row selection line, at least one column selection line that intersects with the first row selection line, and a first fuse circuit including a first fuse array, and suitable for outputting a first fuse signal programmed in the first fuse array by using an external voltage as a source voltage in a power-up mode, wherein the first fuse array includes at least one first fuse cell coupled with the first row selection line and the column selection line.

20 Claims, 11 Drawing Sheets

SEMICONDUCTOR DEVICE AND METHOD FOR DRIVING THE SAME

CROSS-REFERENCE TO RELATED APPLICATIONS

The present application claims priority of Korean Patent Application No. 10-2013-0153173, filed on Dec. 10, 2013, which is incorporated herein by reference in its entirety.

BACKGROUND

1. Field

Exemplary embodiments of the present invention relate to a semiconductor design technology, and more particularly, to a semiconductor device with a fuse circuit, and a method for driving the same.

2. Description of the Related Art

In general, a semiconductor device includes a fuse circuit for storing various pieces of information for setting an operation environment. For example, redundancy information corresponding to defects, trimming information for internal voltages, mode register set (MRS) information, and so on are stored in the fuse circuit.

Fuse circuits may be classified into physical fuse circuits, where the connection is controlled by laser radiation, and electrical fuse circuits, where the connection is controlled by an electrical signal.

Recently electrical fuse circuits have been widely used because, as opposed to physical fuse circuits, the connection of the electrical fuse circuit is controllable at a package level.

Figure 1:
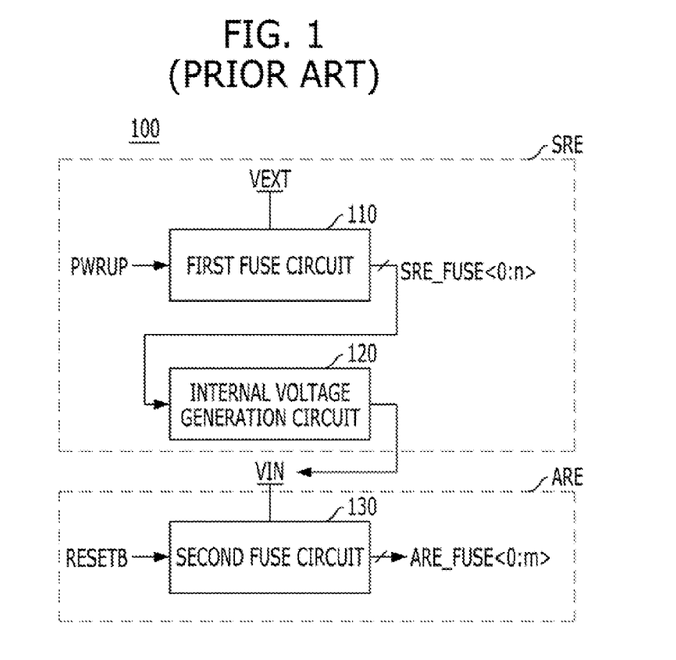
FIG. 1 is a block diagram illustrating a conventional semiconductor device.

FIG. 1 is a block diagram illustrating a conventional semiconductor device 100.

Referring to FIG. 1, the conventional semiconductor device 100 includes a first fuse circuit 110, an internal voltage generation circuit 120, and a second fuse circuit 130. The first fuse circuit 110 outputs internal voltage setting signals SRE_FUSE<0:n> for trimming an internal voltage by using an external voltage VEXT in a power-up mode. The internal voltage generation circuit 120 generates the internal voltage VIN in response to the internal voltage setting signals SRE_FUSE<0:n>. The second fuse circuit 130 outputs repair signals ARE_FUSE<0:m> by using the internal voltage VIN in a boot-up mode.

The power-up mode is a power-up section where the external voltage VEXT is supplied during an initial operation of the conventional semiconductor device 100, and the external voltage VEXT rises from a ground voltage VSS level to a predetermined target level in the power-up section. A power-up signal PWRUP rises corresponding to the external voltage VEXT in the power-up section and then maintains the ground voltage VSS level when the external voltage VEXT rises over the predetermined target level.

The boot-up mode is a section where a plurality of fuse signals, programmed in the second fuse circuit 130, is sequentially read out, and a boot-up operation is normally performed when the internal voltage VIN is set up. The boot-up mode may be entered by a reset signal RESETB inputted from an exterior. Although it is not illustrated in the drawing, the boot-up mode may be entered by an internal signal enabled a predetermined time after the power-up mode is completed.

Figure 2:
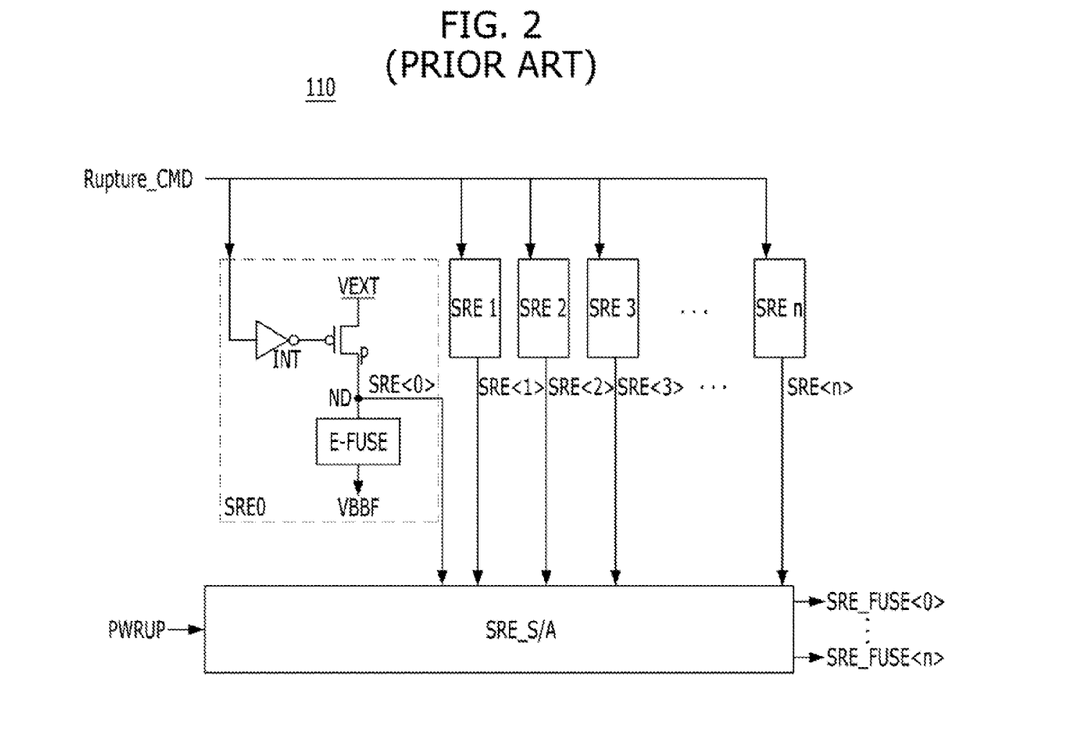
FIG. 2 is a detailed diagram of a first fuse circuit shown in FIG. 1.

FIG. 2 is a detailed block diagram of the first fuse circuit 110 shown in FIG. 1.

Referring to FIG. 2, the first fuse circuit 110 includes a plurality of single e-fuse circuits SRE0 to SREn and a first sense amplification unit SRE_S/A. The single e-fuse circuits SRE0 to SREn are programmed by a rupture command Rupture_CMD and generate respective first fuse signals SRE<0> to SRE<n> corresponding to whether the single e-fuse circuits SRE0 to SREn are programmed or not. The first sense amplification unit SRE_S/A generates the internal voltage setting signals SRE_FUSE<0:n> in response to the power-up signal PWRUP and the first fuse signals SRE<0> to SRE<n>.

Each of the single e-fuse circuits SRE0 to SREn include an input unit INT for receiving the rupture command Rupture_CMD, a driving unit P for supplying the external voltage VEXT to a sense amplification node ND in response to the rupture command inputted through the input unit INT, and an e-fuse, which is coupled between the sense amplification node ND and a low voltage terminal VBBF.

Although it is not illustrated in the drawing, the first sense amplification unit SRE_S/A includes a plurality of latch units for latching the fuse signals SRE<0> to SRE<n> in response to the power-up signal PWRUP.

Figure 3:
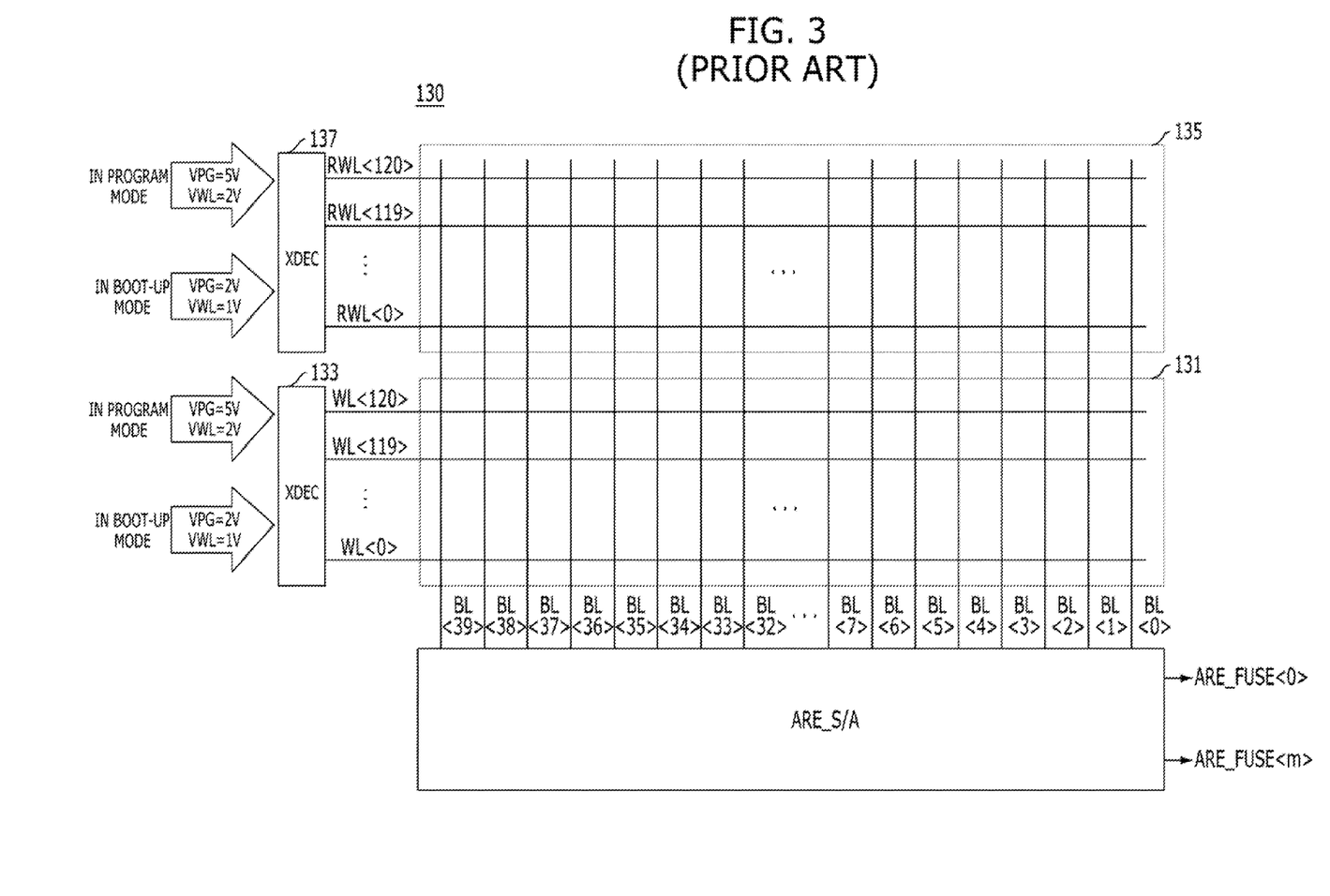
FIG. 3 is a detailed diagram of a second fuse circuit shown in FIG. 1.
Figure 4A:
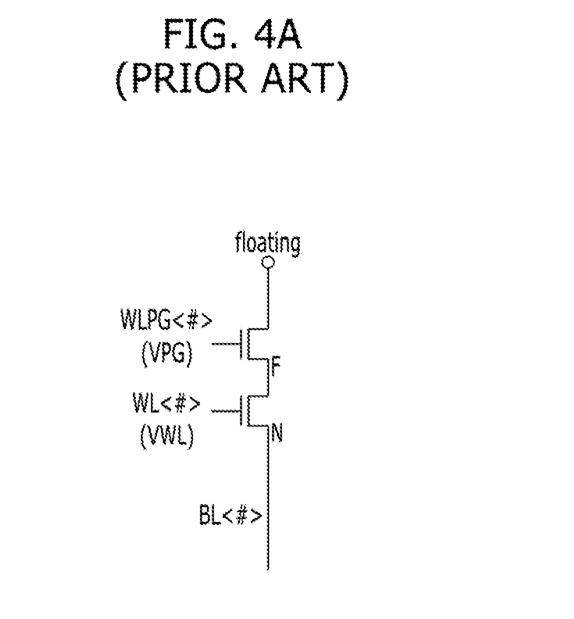
FIGS. 4A and 4B are detailed diagrams for describing an operation of a fuse cell included in a fuse array shown in FIG. 3.
Figure 4B:
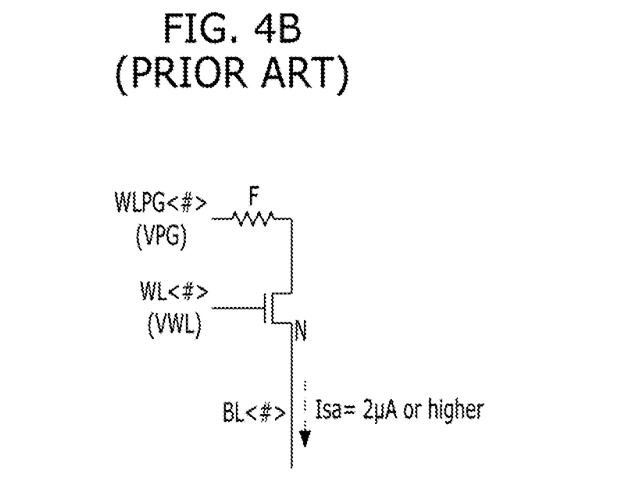

FIG. 3 is a detailed block diagram of the second fuse circuit 130 shown in FIG. 1. FIGS. 4A and 4B are detailed diagrams for describing an operation of a fuse cell included in a fuse array shown in FIG. 3.

Referring to FIG. 3, the second fuse circuit 130 includes a fuse array 131, a row driving unit 133, a redundancy fuse array 135, a redundancy row driving unit 137, and a second sense amplification unit 139. The fuse array 131 is coupled with a plurality of row select lines WL<0> to WL<120> and a plurality of column select lines BL<0> to BL<39>. The row driving unit 133 activates one among the row selection lines WL<0> to WL<120>. The redundancy fuse array 135 is coupled with a plurality of redundancy row selection lines RWL<0> to RWL<120> and the column selection lines BL<0> to BL<39>. The redundancy row driving unit 137 activates one among the redundancy row selection lines RWL<0> to RWL<120>. The second sense amplification unit 139 generates the repair signals ARE_FUSE<0:m> by sensing and amplifying a plurality of second fuse signals of the column selection lines BL<0> to BL<39>.

The fuse array 131 includes fuse cells, which are formed at every intersection of the row selection lines WL<0> to WL<120> and the column selection lines BL<0> to BL<39>. As shown in FIG. 4A, each of the fuse cells include a fuse F coupled with a row fuse line WLPG<#> and a switching unit N for selectively coupling the fuse F with a column selection line BL<#> based on whether a row selection line WL<#> is activated or not. As a program voltage VPG is supplied to the row fuse line WLPG<#>, and a selection voltage VWL is supplied to the row selection line WL<#>, and a ground voltage VSS is supplied to the column selection line BL<#> in a program mode, a high voltage difference between both terminals of the fuse F occurs and the fuse F is changed from a high resistance state to a low resistance state. For example, the program voltage VPG is 5V and the selection voltage VWL is 2V in the program mode. FIG. 4B shows that the fuse F is programmed and changed to the low resistance state. When the fuse F is programmed, as a read voltage VPG is supplied to the row fuse line WLPG<#> and the selection voltage VWL is supplied to the row selection line WL<#> in a boot-up mode, a current Isa corresponding to the read voltage VPG flows through the column selection line BL<#>. For example, the read voltage VPG is 2V and the selection voltage VWL is 1V in the boot-up mode.

FIG. 3 illustrates the row selection lines WL<0> to WL<120> between the row driving unit 133 and the fuse array 131, and FIG. 4 illustrates a plurality of row fuse lines WLPG<0> to WLPG<120> between the row driving unit 133 and the fuse array 131.

The redundancy fuse array 135 and the redundancy row driving unit 137 shown in FIG. 3 are formed to improve operation reliability of the fuse array 131 and the row driving unit 133 and perform the same operation as the fuse array 131 and the row driving unit 133 and thus detailed descriptions are omitted.

Operation of a conventional semiconductor device 100 having the above-described structure is described next.

A fuse program operation is performed to the first fuse circuit 110 and the second fuse circuit 130 based on system requirements set in a test mode. For example, an e-fuse E-FUSE included in a corresponding single e-fuse circuit SRE# is programmed in the first fuse circuit 110 based on a rupture command Rupture_CMD, and as a corresponding row selection line WL<#> and a corresponding column selection line BL<#> are selected and a program voltage VPG is supplied through a corresponding row fuse line WLPG<#>, a corresponding fuse F is programmed in the second fuse circuit 130.

When entered in a power-up mode, the first fuse circuit 110 reads out a plurality of first fuse signals SRE<0> to SRE<n> programmed in a plurality of single e-fuse circuits SRE0 to SREn and generates internal voltage setting signals SRE_FUSE<0> to SRE_FUSE<n> corresponding to the read-out first fuse signals SRE<0> to SRE<n>. The first fuse signals SRE<0> to SRE<n> are read out simultaneously and are latched as the internal voltage setting signals SRE_FUSE<0> to SRE_FUSE<n>.

The internal voltage generation circuit 120 generates a predetermined internal voltage VIN in response to the internal voltage setting signals SRE_FUSE<0> to SRE_FUSE<n>.

Subsequently, when entered in a boot-up mode, the second fuse circuit 130 reads out a plurality of second fuse signals programmed in the fuse array 131 and then generates the repair signals ARE_FUSE<0> to ARE_FUSE<m> corresponding to the read-out second fuse signals. The second fuse signals are sequentially read out by the row driving unit 133 and the second sense amplification unit 139 and are sequentially latched as the repair signals ARE_FUSE<0> to ARE_FUSE<m>.

In conclusion, the conventional semiconductor device 100 controls an internal voltage generation operation which must be performed prior to the boot-up mode. The conventional semiconductor device 100 controls the internal voltage generation operation through the first fuse circuit 110 in the power-up mode and normally reads out fuse signals programmed in the second fuse circuit 130 as entering the boot-up mode when the internal voltage is in a stable state.

Since a conventional semiconductor device 100 having the above-described structure reads out the first fuse signals SRE<0> to SRE<n> corresponding to the internal voltage setting signals SRE_FUSE<0> to SRE_FUSE<n> at once in the power-up mode, the conventional semiconductor device 100 does not need time to boot up and has an advantage in reading out plenty of second fuse signals in the boot-up mode.

However, the conventional semiconductor device 100 has concerns in that it may not be controlled and its processes are complicated since the first fuse circuit 110 and the second fuse circuit 130 are formed differently from one another.

SUMMARY

Exemplary embodiments of the present invention are directed to a semiconductor device where fuse circuits used in different operation modes have the same components and configurations, and a method for driving the semiconductor device.

In accordance with an embodiment of the present invention, a semiconductor device may include at least one first row selection line; at least one column selection line that intersects with the first row selection line; and a first fuse circuit having a first fuse array being suitable for outputting a first fuse signal programmed in the first fuse array by using an external voltage as a source voltage in a power-up mode, wherein the first fuse array includes at least one first fuse cell coupled with the first row selection line and the column selection line.

In accordance with another embodiment of the present invention, a semiconductor device may include a first fuse array, which is coupled with a plurality of first row selection lines and a plurality of column selection lines and suitable for outputting, in a boot-up mode, a plurality of first fuse signals to the column selection lines in response to a first selection voltage supplied through the first row selection lines; a first sense amplification unit suitable for generating information signals by sensing and amplifying the first fuse signals; a first row driving unit suitable for driving the first row selection lines with the first selection voltage corresponding to an internal voltage in the boot-up mode; a second fuse array, which is coupled with a plurality of second row selection lines and part or all of the column selection lines and suitable for outputting, in a power-up mode prior to the boot-up mode, a plurality of second fuse signals to part or all the column selection lines in response a second selection voltage supplied through the second row selection lines; a second sense amplification unit suitable for generating internal voltage setting signals by sensing and amplifying the second fuse signals; and a second row driving unit suitable for driving the second row selection lines with the second selection voltage corresponding to an external voltage in the power-up mode.

In accordance with another embodiment of the present invention, a method for driving a semiconductor device having first and second fuse arrays, which share a plurality of column selection lines, may include in power-up mode, reading out a plurality of second fuse signals programmed in the second fuse array by using an external voltage simultaneously by a unit of a row through the column selection lines, and latching internal voltage setting signals corresponding to the second fuse signals into a second sense amplification unit; generating a predetermined internal voltage in response to the internal voltage setting signals; and in a boot-up mode, sequentially reading out a plurality of first fuse signals programmed in the first fuse array by using the internal voltage through the column selection lines and sequentially storing information signals corresponding to the first fuse signals into a first sense amplification unit.

DETAILED DESCRIPTION

Exemplary embodiments of the present invention will be described below in more detail with reference to the accompanying drawings. These embodiments are provided so that this disclosure will be thorough and complete, and will fully convey the scope of the present invention to those skilled in the art.

The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

The drawings are not necessarily to scale and in some instances, proportions may have been exaggerated in order to clearly illustrate features of the embodiments. In this specification, specific terms have been used. The terms are used to describe the present invention and are not used to qualify the sense or limit the scope of the present invention.

It is also noted that in this specification, 'and/or' represents that one or more of components arranged before and after 'and/or' is included. Furthermore, "connected/coupled" refers to one component not only directly coupling another component but also indirectly coupling another component through an intermediate component. In addition, a singular form may include a plural form as long as it is not specifically mentioned. Furthermore, 'include/comprise' or 'including/comprising' used in the specification represents that one or more components, steps, operations, and elements exists or are added.

Figure 5:
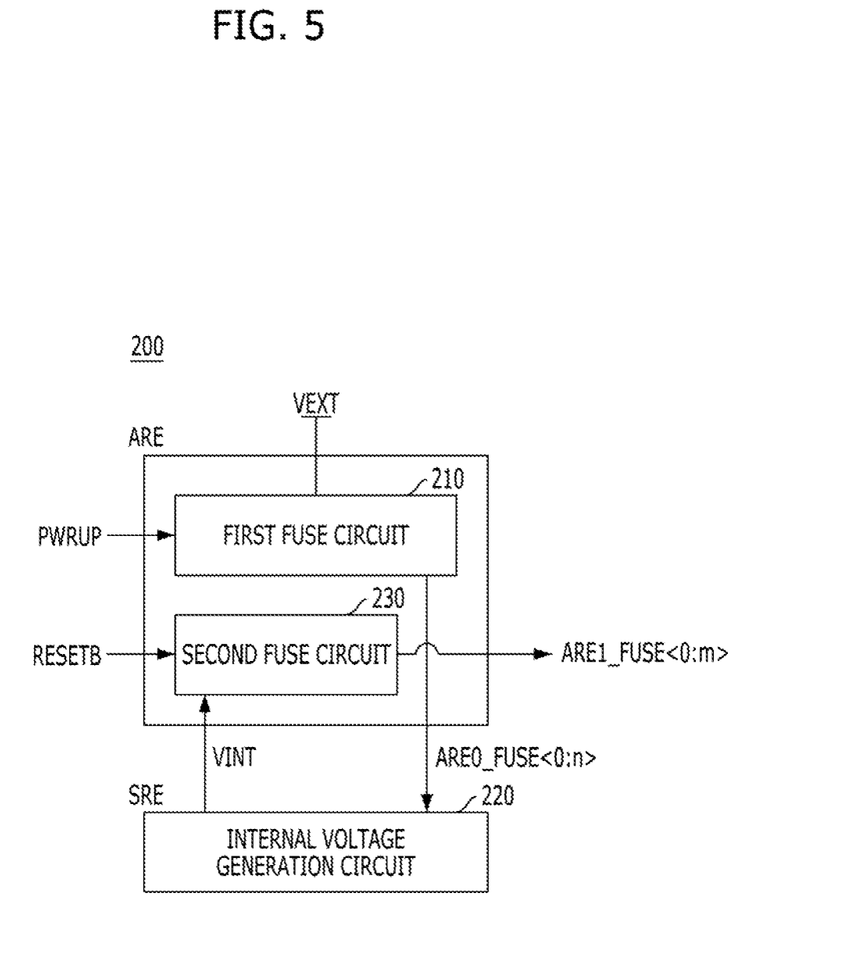
FIG. 5 is a block diagram illustrating a semiconductor device in accordance with an embodiment of the present invention.

FIG. 5 is a block diagram illustrating a semiconductor device 200 in accordance with an embodiment of the present invention.

Referring to FIG. 5, the semiconductor device 200 may include a first fuse circuit 210, an internal voltage generation circuit 220, and a second fuse circuit 230. The first fuse circuit 210 outputs internal voltage setting signals ARE0_FUSE<0:n> for trimming an internal voltage by using an external voltage VEXT in a power-up mode. The internal voltage generation circuit 220 generates the internal voltage VIN as a boot-up pre-operation requisite to a boot-up operation before entering a boot-up mode in response to the internal voltage setting signals ARE0_FUSE<0:n>. The second fuse circuit 230 outputs information signals (e.g., repair signals) ARE1_FUSE<0:m> by using the internal voltage VIN in the boot-up mode.

The power-up mode denotes a power-up section where the external voltage VEXT is supplied during an initial operation of the semiconductor device 200, and the external voltage VEXT rises from a ground voltage VSS level to a predetermined target level in the power-up section. A power-up signal PWRUP rises corresponding to the external voltage VEXT in the power-up section and then maintains the ground voltage VSS level when the external voltage VEXT rises over the predetermined target level. The power-up signal PWRUP may include a power-up pre-signal PWRUPB-PRE, a power-up reference signal PWRUPB and a power-up post-signal PWRUPB_POST, which are sequentially deactivated in the power-up section.

The boot-up mode is a section where a plurality of fuse signals programmed in the second fuse circuit 230 is sequentially read out, and a boot-up operation is normally performed when the internal voltage VIN is set up. The boot-up mode may be entered by a reset signal RESETB inputted from an exterior. Although it is not illustrated in the drawing, the boot-up mode may be entered by an internal signal enabled a predetermined time after the power-up mode is completed.

Figure 6:
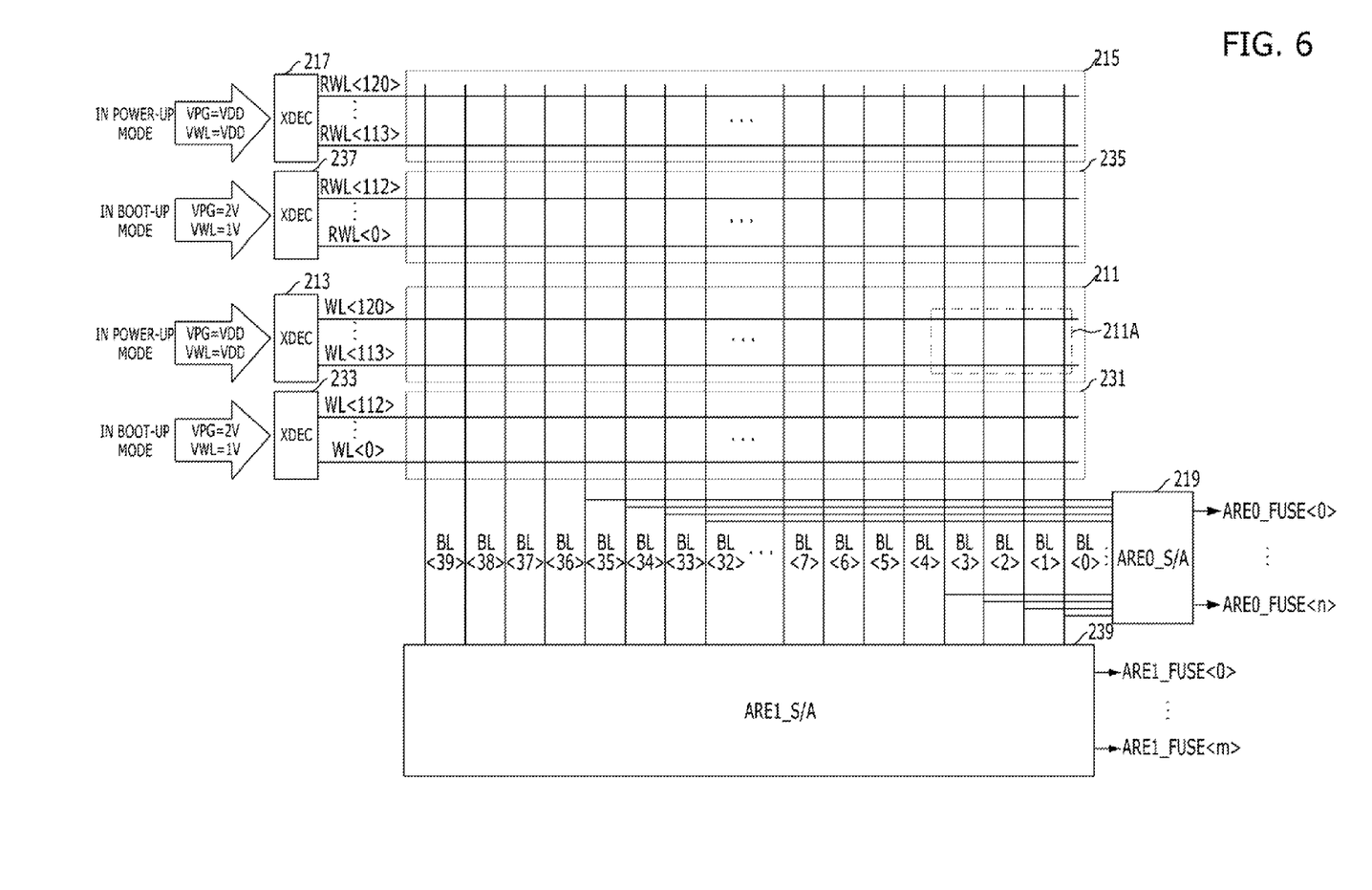
FIG. 6 is a detailed diagram of first and second fuse circuits shown in FIG. 5.

FIG. 6 is a detailed diagram of the first and second fuse circuits 210 and 230 shown in FIG. 5.

Referring to FIG. 6, the first fuse circuit 210 may include a first fuse array 211, a first row driving unit 213, a first redundancy fuse array 215, a first redundancy row driving unit 217, and a first sense amplification unit 219. The first fuse array 211 is coupled with a plurality of first row selection lines WL<113> to WL<120> and a part BL<0> to BL<3>, ..., BL<32> to BL<35> of a plurality of column selection lines BL<0> to BL<39> and outputs a plurality of first fuse signals to the partial column selection lines BL<0> to BL<3>, ..., BL<32> to BL<35> in response to a first selection voltage supplied through the first row selection lines WL<113> to WL<120> in a power-up mode. The first row driving unit 213 supplies the first selection voltage corresponding to an external voltage VEXT to the row selection lines WL<113> to WL<120> in the power-up mode. The first redundancy fuse array 215 is coupled with a plurality of first redundancy row selection lines RWL<113> to RWL<120> and the partial column selection lines BL<0> to BL<3>, ..., BL<32> to BL<35> and outputs the fuse signal to the partial column selection lines BL<0> to BL<3>, ..., BL<32> to BL<35> in response to a first redundancy selection voltage supplied through the first redundancy row selection lines RWL<113> to RWL<120> in the power-up mode.

The first redundancy row driving unit 217 supplies the first redundancy selection voltage corresponding to the external voltage VEXT to the redundancy row selection lines RWL<113> to RWL<120> in the power-up mode. The first sense amplification unit 219 generates internal voltage setting signals ARE0_FUSE<0> to ARE0_FUSE<n> by sensing and amplifying the fuse signals supplied through the partial column selection lines BL<0> to BL<3>, ..., BL<32> to BL<35>.

Figure 7:
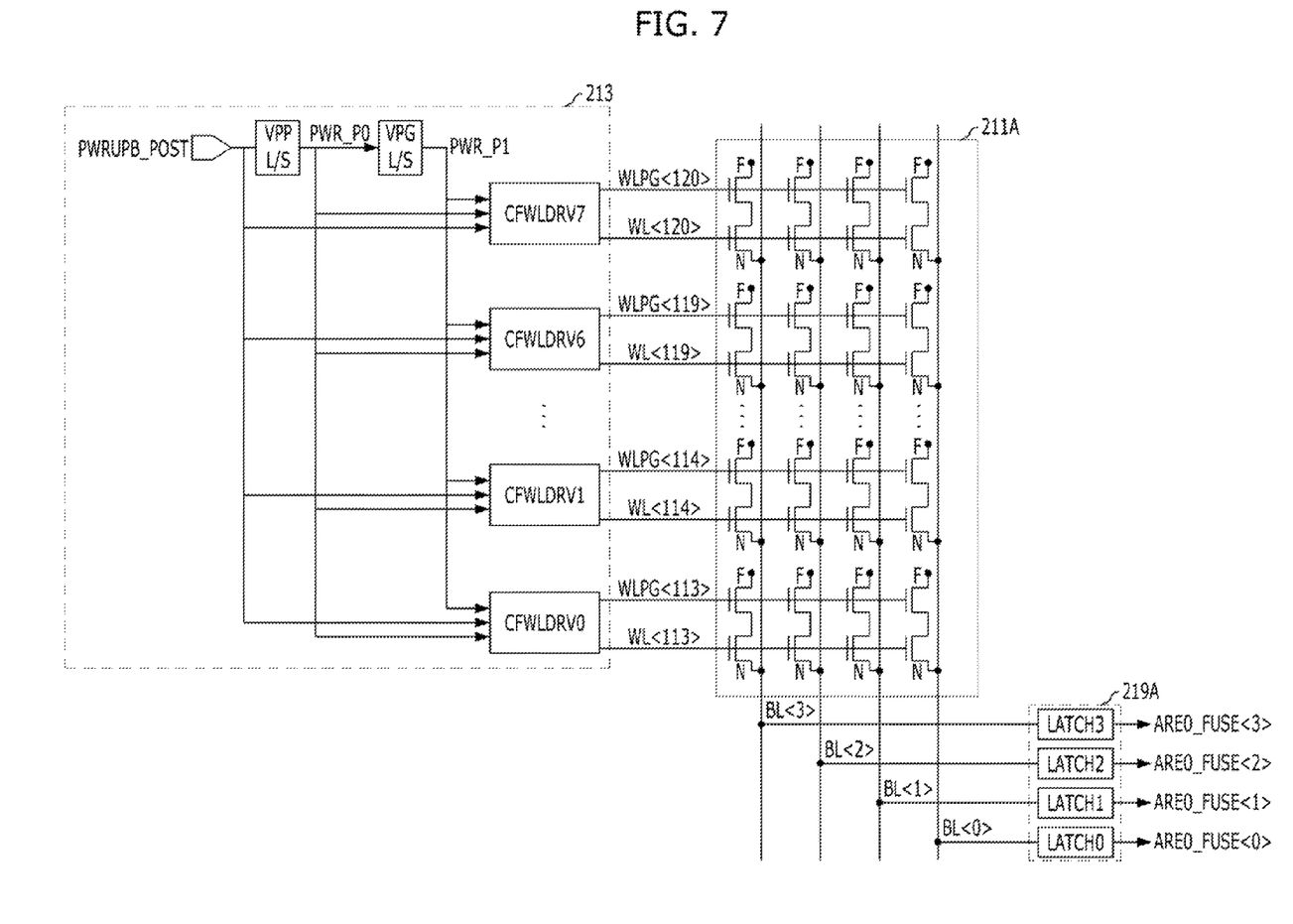
FIG. 7 is a detailed diagram illustrating a part of the first fuse circuit, a part of a first row driving unit and a part of a first sense amplification unit shown in FIG. 6.
Figure 8:
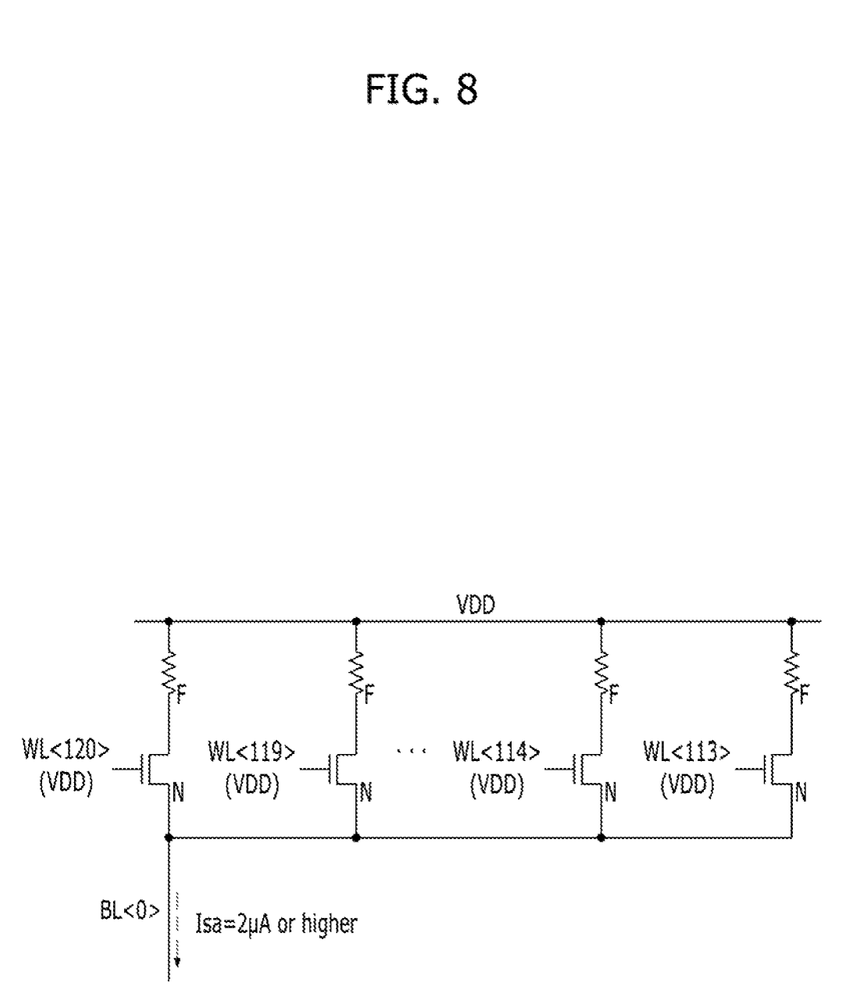
FIG. 8 is a diagram for describing an operation of a plurality of fuse cells coupled with a first column selection line shown in FIG. 7.

FIG. 7 is a detailed diagram of the first fuse circuit 211, the first row driving unit 213 and the first sense amplification unit 219 shown in FIG. 6. FIG. 8 is a diagram for describing an operation of a plurality of fuse cells coupled with a first column selection line BL<0> shown in FIG. 7.

FIG. 7 illustrates a part 211A of the first fuse array 211 and a part 219A of the first sense amplification unit 219 corresponding to the part 211A of the first fuse array 211.

Referring to FIG. 7, the partial fuse array 211A may include fuse cells, which are formed at every intersection of the first row selection lines WL<113> to WL<120> and the partial column selection lines BL<0> to BL<3>. The fuse cells may include fuses F coupled with the respective first row fuse lines WLPG<113> to WLPG<120> and a switching units N for selectively coupling the fuses F with the respective column selection lines BL<0> to BL<3> based on whether the row selection lines WL<113> to WL<120> are activated or not. As a program voltage is supplied to the row fuse lines WLPG<113> to WLPG<120>, and a selection voltage is supplied to the row selection lines WL<113> to WL<120>, and a ground voltage VSS is supplied to the column selection lines BL<0> to BL<3> in a program mode, a high voltage difference between both terminals of each of the fuses F occurs and each of the fuses F is changed from a high resistance state to a low resistance state (refer to FIGS. 4A and 4B). In the embodiment of the present invention, a plurality of fuses F coupled with the row fuse lines WLPG<113> to WLPG<120> are programmed by a column selection line BL<#>, i.e., by 1 bit of a fuse signal. The reason is as follows. As a read voltage is supplied to the row fuse lines WLPG<113> to WLPG<120> and the selection voltage is supplied to the row selection lines WL<113> to WL<120> in a power-up mode, a current corresponding to the read voltage flows through the column selection line BL<#>. Since the read voltage and the selection voltage in the power-up mode correspond to an external voltage VEXT=VDD≈1V, a plurality of fuse cells are programmed and simultaneously are read out so that a current corresponding to the 1 bit fuse signal may flow through the column selection line BL<#>. For example, referring to FIG. 8, the fuse cells coupled with a first column selection line BL<0> are all programmed, and as the read voltage VDD is simultaneously supplied to the row fuse lines WLPG<113> to WLPG<120> and the selection voltage VDD is simultaneously supplied to the row selection lines WL<113> to WL<120> in the power-up mode, a current Isa suitable for sensing and amplifying the 1 bit fuse signal flows through the first column selection line BL<0>.

FIG. 6 illustrates only the row selection lines WL<113> to WL<120> between the first row driving unit 213 and the first fuse array 211, and FIG. 7 illustrates the row fuse lines WLPG<113> to WLPG<120> along with the row selection lines WL<113> to WL<120> between the first row driving unit 213 and the first fuse array 211.

Referring to FIG. 7, the first row driving unit 213 may include a first level shifter VPP_L/S, a second level shifter VPG_L/S, and a plurality of line driving units CFWLDRV0 to CFWLDRV7. The first level shifter VPP_L/S generates a first power-up signal PWR_P0 in response to a power-up post-signal PWRUPB_POST. The second level shifter VPG_L/S generates a second power-up signal PWR_P1 in response to the first power-up signal PWR_P0. The line driving units CFWLDRV0 to CFWLDRV7 activate the row fuse lines WLPG<113> to WLPG<120> and the row selection lines WL<113> to WL<120> in response to the power-up post-signal PWRUPB_POST and the first and second power-up signals PWR_P0 and PWR_P1.

The line driving units CFWLDRV0 to CFWLDRV7 may supply the program voltage (e.g. 5V) to the row fuse lines WLPG<113> to WLPG<120> and supply the selection voltage (e.g. 2V) to the row selection lines WL<113> to WL<120> in the program mode, and may supply the external voltage VDD to the row fuse lines WLPG<113> to WLPG<120> and the row selection lines WL<113> to WL<120> in the power-up mode. Since the line driving units CFWLDRV0 to CFWLDRV7 have the same structures, just a first line driving unit CFWLDRV0 is described hereafter.

Figure 9:
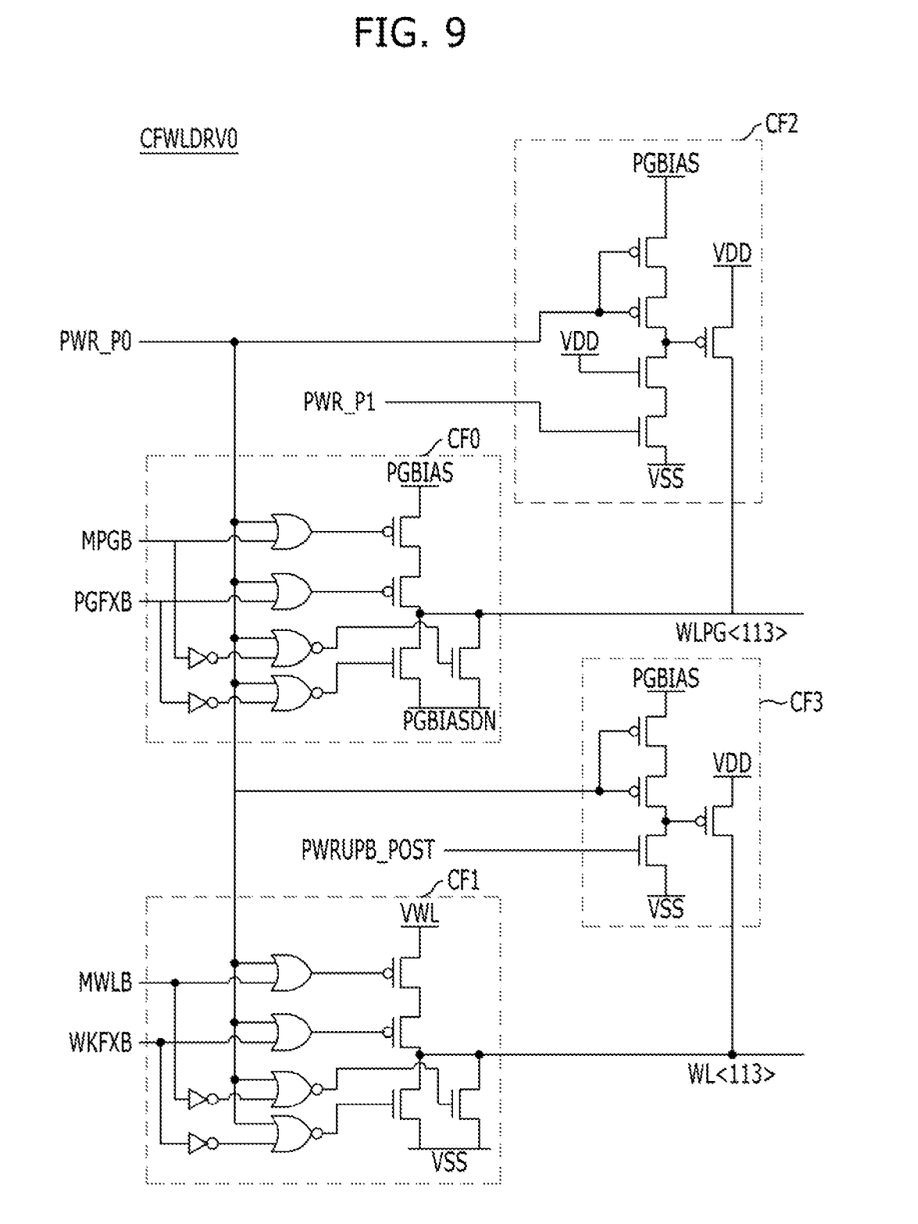
FIG. 9 is a detailed diagram of a first line driving unit shown in FIG. 7.

FIG. 9 is a detailed diagram of the first line driving unit CFWLDRV0 shown in FIG. 7.

Referring to FIG. 9, the first line driving unit CFWLDRV0 may include a first fuse line driving unit CF0, a first selection line driving unit CF1, a second fuse line driving unit CF2, and a second selection line driving unit CF3. The first fuse line driving unit CF0 drives a corresponding row fuse line WLPG<113> with a program voltage PGBIAS in response to program operation signals MPGB and PGFXB in a program mode. The first selection line driving unit CF1 drives a corresponding row selection line WL<113> with a selection voltage VWL in response to program selection signals MWLB and WKFXB in the program mode. The second fuse line driving unit CF2 drives the corresponding row fuse line WLPG<113> with an external voltage VDD in response to first and second power-up signals PWR_P0 and PWR_P1 in a power-up mode. The second selection line driving unit CF3 drives the row selection line WL<113> with the external voltage VDD in response to a power-up post-signal PWRUPB_POST and the first power-up signal PWR_P0 in the power-up mode.

Referring back to FIG. 7, the first sense amplification unit 219 may include a plurality of latch circuits 219A. The latch circuits 219A latch fuse signals supplied through the column selection lines BL<0> to BL<3> in the power-up mode. Since the latch circuits 219A have the same structures, just a first latch circuit LATCH0 is described.

Figure 10:
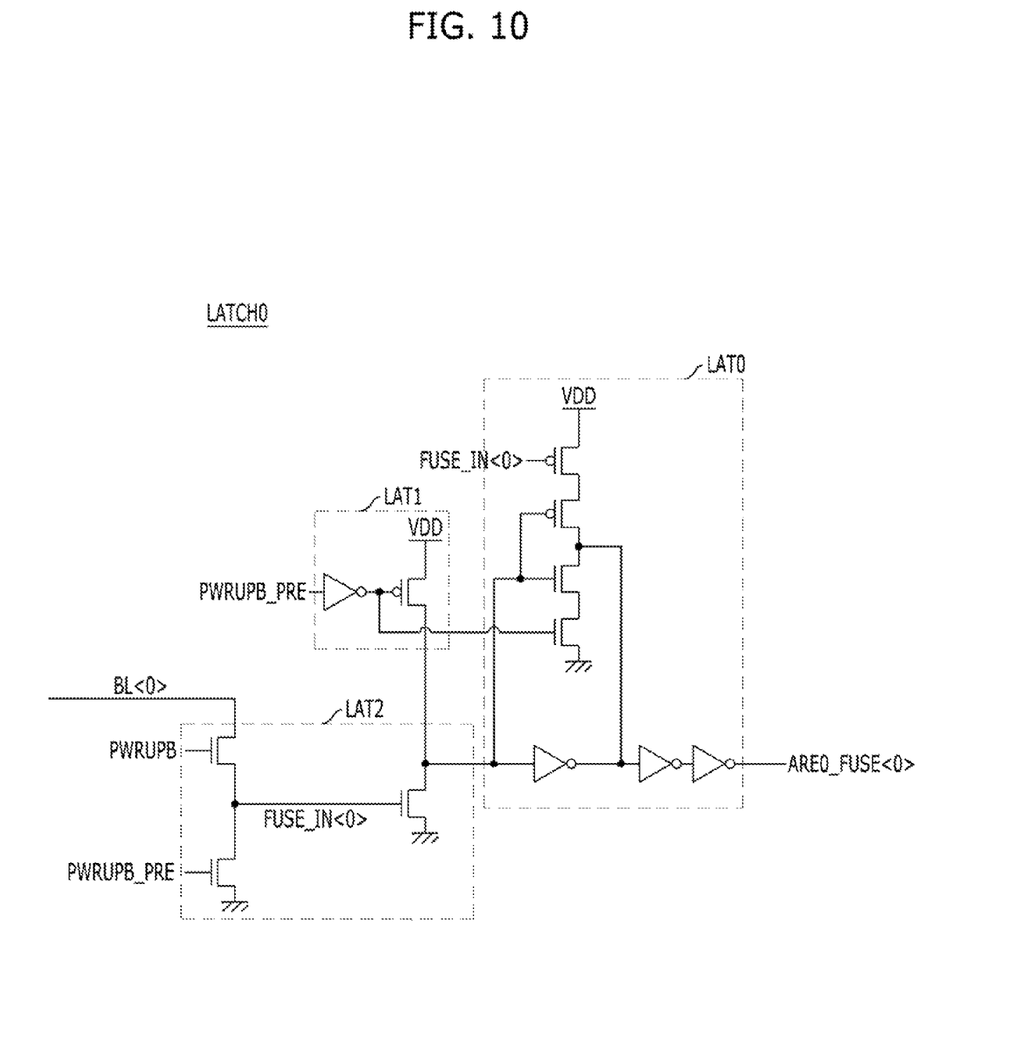
FIG. 10 is a detailed diagram of a first latch circuit shown in FIG. 7.

FIG. 10 is a detailed diagram of the first latch circuit LATCH0 shown in FIG. 7.

Referring to FIG. 10, the first latch circuit LATCH0 may include a latch unit LAT0, an initial value setting unit LAT1, and a fuse signal setting unit LAT2. The latch unit LAT0 outputs an internal voltage setting signal ARE0_FUSE<0>. The initial value setting unit LAT1 provides an initial value to an input terminal of the latch unit LAT0 in response to a power-up pre-signal PWRUPB-PRE. The fuse signal setting unit LAT2 provides a fuse signal supplied through a first column selection line BL<0> to the input terminal of the latch unit LAT0 in response to the power-up pre-signal PWRUPB-PRE and a power-up reference signal PWRUPB.

Referring back to FIG. 6, the first redundancy fuse array 215 and the first redundancy row driving unit 217 are formed to improve operation reliability of the first fuse array 211 and the first row driving unit 213. Since the first redundancy fuse array 215 and the first redundancy row driving unit 217 perform the same operations as the first fuse array 211 and the first row driving unit 213, a detailed description thereon is omitted. To prevent getting in the way of the thrust of the present invention, a description on operations of the first redundancy fuse array 215 and the first redundancy row driving unit 217 is also omitted.

Referring back to FIG. 6, the second fuse circuit 230 may include a second fuse array 231, a second row driving unit 233, a second redundancy fuse array 235, a second redundancy row driving unit 237, and a second sense amplification unit 239. The second fuse array 231 is coupled with a plurality of second row selection lines WL<0> to WL<112> and a plurality of column selection lines BL<0> to BL<39> and outputs a plurality of second fuse signals to the column selection lines BL<0> to BL<39> in response to a second selection voltage supplied through the second row selection lines WL<0> to WL<112> in a boot-up mode. The second row driving unit 233 supplies the second selection voltage corresponding to an internal voltage VIN to the second row selection lines WL<0> to WL<112> in the boot-up mode. The second redundancy fuse array 235 is coupled with a plurality of second redundancy row selection lines RWL<0> to RWL<112> and the column selection lines BL<0> to BL<39> and outputs the second fuse signals to the column selection lines BL<0> to BL<39> in response to a second redundancy selection voltage supplied through the second redundancy row selection lines RWL<0> to RWL<112> in the boot-up mode. The second redundancy row driving unit 237 supplies the second redundancy selection voltage corresponding to the internal voltage VIN to the second redundancy row selection lines RWL<0> to RWL<112> in the boot-up mode. The second sense amplification unit 239 generates the information signals ARE1_FUSE<0> to ARE1_FUSE<n> by sensing and amplifying the second fuse signals supplied through the column selection lines BL<0> to BL<39>.

Since the second fuse array 231, the second row driving unit 233, the second redundancy fuse array 235, and the second redundancy row driving unit 237 have the same structures as the fuse array 131, the row driving unit 133, the redundancy fuse array 135, and the redundancy row driving unit 137 of the conventional semiconductor device 100 shown in FIG. 1, a detailed description thereon is omitted. The second sense amplification unit 239 may have different structures from the sense amplification unit 139 of the conventional semiconductor device 100. Thus, just the second sense amplification unit 239 is described.

Figure 11:
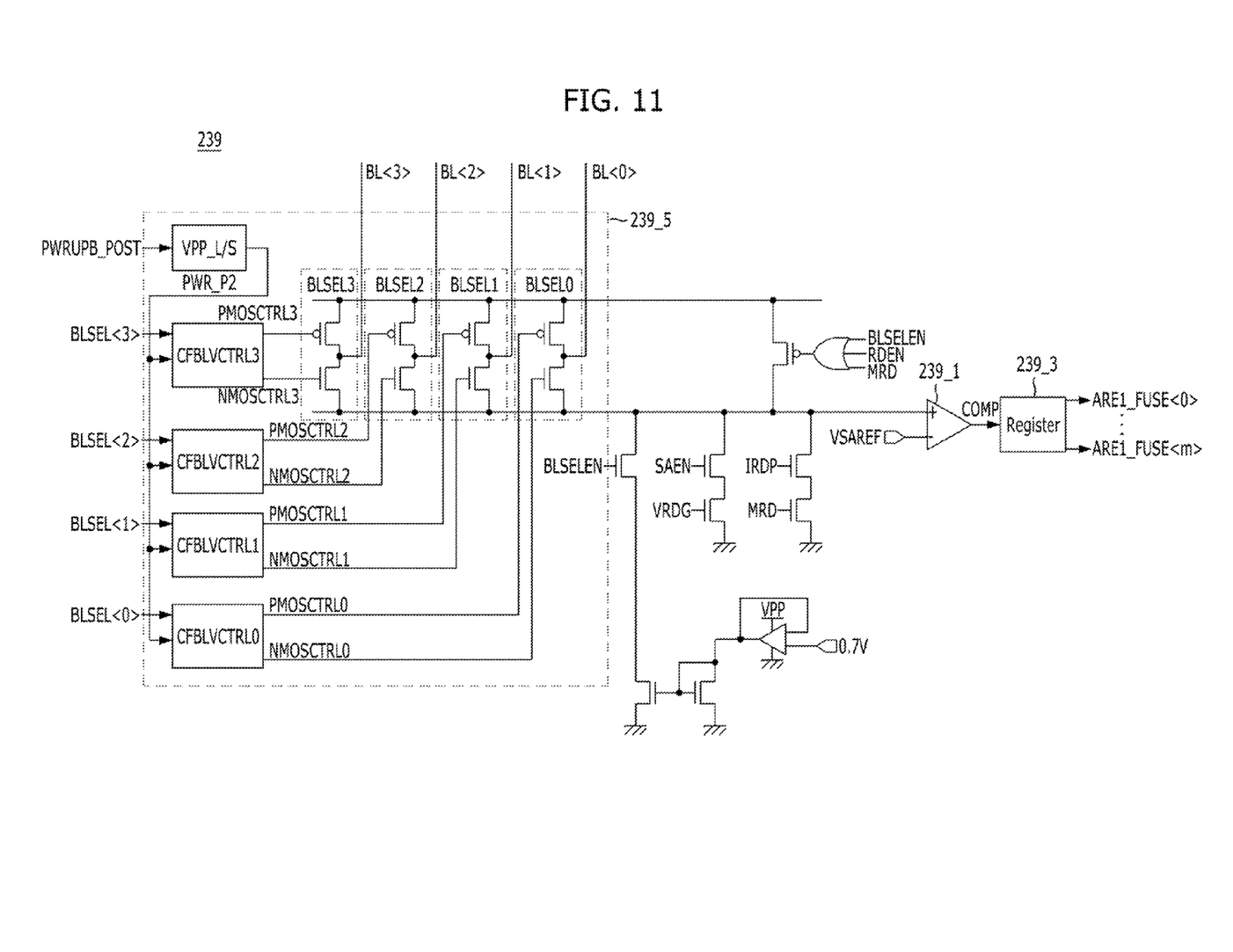
FIG. 11 is a detailed diagram illustrating a part of a second sense amplification unit shown in FIG. 6.

FIG. 11 is a detailed diagram illustrating an example of the second sense amplification unit 239 shown in FIG. 6.

For convenience and ease of explanation, only structures corresponding to the partial first fuse array 211A are illustrated in FIG. 11.

Referring to FIG. 11, the second sense amplification unit 239 may include a comparison unit 239_1, a register unit 239_3, and a column selection unit 239_5. The comparison unit 239_1 sequentially compares a plurality of second fuse signals supplied through a plurality of column selection lines BL<0> to BL<39> with a reference signal VSAREF in a boot-up mode. The register unit 239_3 stores a comparison signal COMP sequentially outputted from the comparison unit 239_1 as the information signals ARE1_FUSEz<0> to ARE1_FUSE<n>. The column selection unit 239_5 selectively couples the column selection lines BL<0> to BL<39> with the comparison unit 239_1 in the boot-up mode and electrically blocks the column selection lines BL<0> to BL<39> from the comparison unit 239_1 in a power-up mode.

The column selection unit 239_5 may include a plurality of column selection coupling units BLSEL0 to BLSEL3, a third level shifter VPP_L/S, and a plurality of column selection control units CFBLVCTRL0 to CFBLVCTRL3. The column selection coupling units BLSEL0 to BLSEL3 are coupled one on one with the column selection lines BL<0> to BL<3> and selectively couple the column selection lines BL<0> to BL<3> with the comparison unit 239_1 in response to a plurality of column selection control signals NMOSCTRL0/PMOSCTRL0 to NMOSCTRL3/PMOSCTRL3. The third level shifter VPP_L/S generates a third power-up signal PWR_P2 in response to a power-up post-signal PWRUPB_POST. The column selection control units CFBLVCTRL0 to CFBLVCTRL3 generate the column selection control signals NMOSCTRL0/PMOSCTRL0 to NMOSCTRL3/PMOSCTRL3 in response to the third power-up signal PWR_P2 and a plurality of column selection signals BLSEL<0> to BLSEL<3>.

Since the column selection control units CFBLVCTRL0 to CFBLVCTRL3 have the same structures, only the first column selection control unit CFBLVCTRL0 is described.

Figure 12:
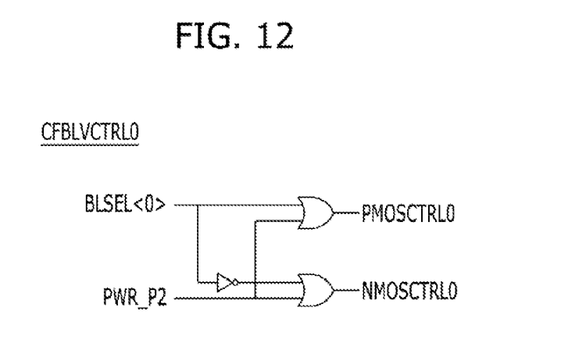
FIG. 12 is a detailed diagram of a first column selection control unit shown in FIG. 11.

FIG. 12 is a detailed diagram of the first column selection control unit CFBLVCTRL0 shown in FIG. 11.

Referring to FIG. 12, the first column selection control unit CFBLVCTRL0 may include an OR gate, an inverter, and a NOR gate. The OR gate performs an OR operation on a first column selection signal BLSEL<0> and the third power-up signal PWR_P2. The inverter inverts the first column selection signal BLSEL<0>. The NOR gate performs a NOR operation on an output signal of the inverter and the third power-up signal PWR_P2.

Since the second redundancy fuse array 235 and the second redundancy row driving unit 237 included in the second fuse circuit 230 are formed to improve operation reliability of the second fuse array 231 and the second row driving unit 233 and perform the same operations as the second fuse array 231 and the second row driving unit 233, a detailed description thereon is omitted. To prevent getting in the way of the thrust of the present invention, a description on operations of the second redundancy fuse array 235 and the second redundancy row driving unit 237 is also omitted.

A method for driving the semiconductor device 200 is described hereafter in accordance with an embodiment of the present invention having the above-described structures.

A fuse program operation may be performed on first and second fuse circuits 210 and 230 based on system requirements set in a test mode. For example, a plurality of first fuse signals are programmed into a first fuse array 211 by a first row driving unit 213 and a second sense amplification unit 239 so that the first fuse circuit 210 may generate internal voltage setting signals ARE0_FUSE<0> to ARE0_FUSE<n> for trimming an internal voltage VIN. A plurality of fuse cells of the same state is programmed by a unit of a column selection line into the first fuse array 211. For example, fuse cells, which are coupled with a first column selection line BL<0>, among the fuse cells included in the first fuse array 211, are all programmed in a high resistance state or in a low resistance state. Also, a plurality of second fuse signals are programmed into a second fuse array 231 by a second row driving unit 233 and the second sense amplification unit 239 so that the second fuse circuit 230 may generate the information signals ARE1_FUSE<0> to ARE1_FUSE<m> for repairing a defective bit.

When entered in a power-up mode, the first fuse circuit 110 reads out the first fuse signals, which are programmed in the first fuse array 211, by a unit of a row through the partial column selection lines BL<0> to BL<3>, . . . , BL<32> to BL<35> by using an external voltage VEXT and at the same time latches the internal voltage setting signals ARE0_FUSE<0> to ARE0_FUSE<n> corresponding to the first fuse signals to a first sense amplification unit 219.

Figure 13:
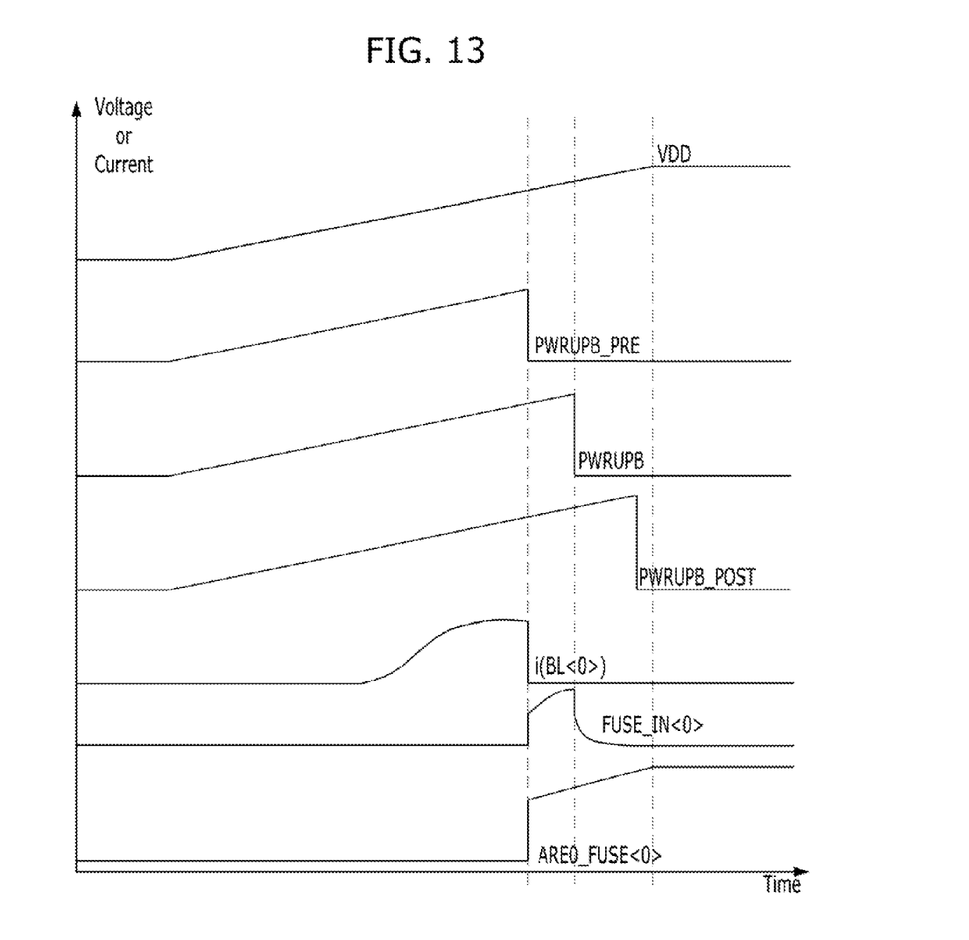
FIG. 13 is a timing diagram for describing a method for driving a semiconductor device in accordance with an embodiment of the present invention.

FIG. 13 is a timing diagram for describing an operation of the first fuse circuit 210 in the power-up mode.

In the embodiment of the present invention, just the process of the first fuse signal of 1 bit being supplied through the first column selection line BL<0> and latched to the first sense amplification 219 is described as an example. It is assumed that fuse cells coupled with the first column selection line BL<0> of the first fuse array 211 are programmed in a low resistance state.

Referring to FIG. 13, the first sense amplification unit 219 initializes the internal voltage setting signal ARE0_FUSE<0> to a logic low level in response to the power-up pre-signal PWRPB_PRE.

Simultaneously, the first row driving unit 213 drives the first row fuse lines WLPG<113> to WLPG<120> and the first row selection lines WL<113> to WL<120> to an external voltage VEXT=VDD in response to the power-up post-signal PWRUPB_POST. Accordingly, a current Isa corresponding to the fuse signal of 1 bit flows through the first column selection line BL<0>.

When the power-up pre-signal PWRPB_PRE is deactivated to the logic low level, the first sense amplification unit 219 receives a fuse signal supplied through the first column selection line BL<0> in response to the power-up reference signal PWRUPB and latches the internal voltage setting signal ARE0_FUSE<0> to a logic high level according to the fuse signal.

Although the structure corresponding to the first column selection line BL<0> is described as above, all the structures corresponding to the partial column selection lines BL<0> to BL<3>, . . . , BL<32> to BL<35> are operated at the same time in the first fuse circuit 210. In other words, the first row fuse lines WLPG<113> to WLPG<120> and the first row selection lines WL<113> to WL<120> are activated at the same time in the power-up mode, and the first fuse signals supplied through the partial column selection lines BL<0> to BL<3>, . . . , BL<32> to BL<35> are read out and latched at the same time. The logic level of the internal voltage setting signal ARE0_FUSE<#> may be changed just for a programmed fuse cell.

The second sense amplification 239 blocks an electrical coupling with the partial column selection lines BL<0> to BL<3>, . . . , BL<32> to BL<35> in response to the power-up post-signal PWRUPB_POST in the power-up mode so that the first sense amplification unit 219 may accurately sense and amplify the respective first fuse signals supplied through the column selection lines BL<0> to BL<3>, . . . , BL<32> to BL<35>.

When the internal voltage setting signals ARE0_FUSE<0> to ARE0_FUSE<n> are set up based on the power-up mode, the internal voltage generation circuit 220 generates a predetermined internal voltage VIN in response to the internal voltage setting signals ARE0_FUSE<0> to ARE0_FUSE<n>.

When entering the boot-up mode, the second fuse circuit 230 reads out a plurality of second fuse signals programmed in the second fuse array 231 and generates the information signals ARE1_FUSE<0> to ARE1_FUSE<m> corresponding to the second fuse signals. The second fuse signals are sequentially read out by the second row driving unit 233 and the column selection unit 239_5, and the second fuse signals, which are sequentially read out are sequentially stored as the information signals ARE1_FUSE<0> to ARE1_FUSE<m>.

In accordance with the embodiments of the present invention as described above, as a fuse circuit used in a power-up mode has the same structure as a fuse circuit used in a boot-up mode, it is easier to control the semiconductor device and its processes are simplified.

While the present invention has been described with respect to the specific embodiments, it should be noted that the embodiments are for describing, not limiting, the present invention. Further, it should be noted that the present invention may be achieved in various ways through substitution, change, and modification by those skilled in the art without departing from the scope of the present invention as defined by the following claims.

Although an example has been described where a fuse signal is read out through only part of a plurality of column selection lines in power-up mode, the present invention and its potential embodiments are not limited in this fashion, and the fuse signal may be read out through all the column selection lines in power-up mode.

Although an example has been described where a plurality of first row selection lines are coupled to a plurality of fuse cells, the present invention and its potential embodiments are not limited in this fashion, and one first row selection line and one fuse cell may be included if a first sense amplification unit may sense a small amount of current.

Although an example has been described where a plurality of fuse cells coupled with a plurality of first row selection lines are programmed in the same state, the present invention and its potential embodiments are not limited in this fashion, and part of the fuse cells may be programmed to a high resistance state and the others may be programmed to a low resistance state.

Although an example has been described where a first fuse circuit generates an internal voltage setting signal relevant to a boot-up, the present invention and its potential embodiments are not limited in this fashion, and the present invention may also be applied in modes other than the boot-up mode. For example, the first fuse circuit may generate a setting signal relevant to a data width option, e.g., X4, X8, etc., mode in the embodiments of the present invention.

What is claimed is:

1. A semiconductor device, comprising:
    at least one first row selection line;
    at least one column selection line that intersects with the first row selection line;
    a first fuse circuit including a first fuse array, and suitable for outputting a first fuse signal programmed in the first fuse array by using an external voltage as a source voltage in a power-up mode, wherein the first fuse array includes at least one first fuse cell coupled with the first row selection line and the column selection line; and
    a second fuse circuit including a second fuse array, and suitable for outputting a second fuse signal programmed in the second fuse array by using the internal voltage as a source voltage in the boot-up mode, wherein the second fuse array includes at least one second fuse cell coupled with at least one second row selection line and the column selection line.

2. The semiconductor device of claim 1, wherein a plurality of first fuse cells are coupled with the column selection line when a plurality of first row selection lines are formed, and the first fuse cells are programmed by a unit of the column selection line in the first fuse circuit in a program mode.

3. The semiconductor device of claim 2, wherein the first row selection lines are activated in the first fuse circuit at substantially the same time in the power-up mode.

4. The semiconductor device of claim 1, further comprising:
    an internal voltage generation circuit suitable for generating an internal voltage used for a boot-up mode before entering the boot-up mode in response to the first fuse signal.

5. A semiconductor device, comprising:
    a first fuse array, which is coupled with a plurality of first row selection lines and a plurality of column selection lines and suitable for outputting, in a boot-up mode, a plurality of first fuse signals to the column selection lines in response to a first selection voltage supplied through the first row selection lines;
    a first sense amplification unit suitable for generating information signals by sensing and amplifying the first fuse signals;

a first row driving unit suitable for driving the first row selection lines with the first selection voltage corresponding to an internal voltage in the boot-up mode;

a second fuse array, which is coupled with a plurality of second row selection lines and part or all of the column selection lines and suitable for outputting, in a power-up mode prior to the boot-up mode, a plurality of second fuse signals to part or all of the column selection lines in response to a second selection voltage supplied through the second row selection lines;

a second sense amplification unit suitable for generating internal voltage setting signals by sensing and amplifying the second fuse signals; and a second row driving unit suitable for driving the second row selection lines with the second selection voltage corresponding to an external voltage in the power-up mode.

6. The semiconductor device of claim 5, further comprising:

an internal voltage generation circuit suitable for generating the internal voltage in response to the internal voltage setting signals.

7. The semiconductor device of claim 5, wherein the first fuse cell array includes a plurality of first fuse cells, and each of the first fuse cells includes:

a fuse where one terminal is coupled with a corresponding row fuse line and the other terminal is coupled with a corresponding selection node; and a switching unit where one terminal is coupled with the selection node and the other terminal is coupled with a corresponding column selection line, with the switching unit performing a switching operation in response to the first selection voltage supplied through a corresponding row selection line.

8. The semiconductor device of claim 7, wherein the first row driving unit supplies a first program voltage through a plurality of first row fuse lines and the first selection voltage corresponding to the first program voltage through the first row selection lines in a program mode, and supplies a first read voltage through the first row fuse lines and the first selection voltage corresponding to the first read voltage through the first row selection lines in the boot-up mode.

9. The semiconductor device of claim 5, wherein the first sense amplification unit comprises:

a comparison unit suitable for sequentially comparing the first fuse signals supplied through the column selection lines in the boot-up mode;

a register unit suitable for storing a comparison signal sequentially outputted from the comparison unit as the information signals; and a column selection unit suitable for selectively coupling the column selection lines with the comparison unit in the boot-up mode and electrically blocking part or all of the column selection lines from the comparison unit in the power-up mode.

10. The semiconductor device of claim 9, wherein the column selection unit comprises:

a plurality of column selection coupling units, which are coupled one on one with the column selection lines, and suitable for selectively coupling the column selection lines with the comparison unit in response to a plurality of column selection control signals; and a plurality of column selection control units suitable for generating the column selection control signals in response to a power-up signal and a plurality of column selection signals.

11. The semiconductor device of claim 5, wherein the second fuse array includes a plurality of second fuse cells, and each of the second fuse cells includes:

a fuse where one terminal is coupled with a corresponding row fuse line and the other terminal is coupled with a selection node; and a switching unit where one terminal is coupled with the selection node and the other terminal is coupled with a corresponding column selection line and performs a switching operation in response to the second selection voltage supplied through a corresponding row selection line.

12. The semiconductor device of claim 11, wherein the second row driving unit supplies a second program voltage through a plurality of second row fuse lines and the second selection voltage corresponding to the second program voltage through the second row selection lines in a program mode, and supplies a second read voltage corresponding to the external voltage through the second row fuse lines and the second selection voltage corresponding to the second read voltage through the second row selection lines in the power-up mode.

13. The semiconductor device of claim 12, wherein the second row driving unit includes a plurality of second line driving units, and each of the second line driving units includes:

a first fuse line driving unit suitable for driving a corresponding row fuse line with the second program voltage in response to program operation signals;

a first selection line driving unit suitable for driving a corresponding row selection line with the second selection voltage corresponding to the second program voltage in response to program selection signals;

a second fuse line driving unit suitable for driving a corresponding row fuse line with the external voltage in response to power-up signals; and a second selection line driving unit suitable for driving a row selection line with the external voltage in response to the power-up signals.

14. The semiconductor device of claim 5, wherein the second sense amplification unit is coupled with part or all of the column selection lines, and includes a plurality of latch circuits suitable for latching fuse signals supplied through a corresponding column selection line in response to power-up signals.

15. The semiconductor device of claim 14, wherein the power-up signals include a power-up pre-signal, a power-up reference signal and a power-up post-signal, which are sequentially deactivated in the power-up mode, and wherein each of the latch circuits includes:

a latch unit suitable for outputting the internal voltage setting signals;

an initial value setting unit suitable for providing an initial value to an input terminal of the latch unit in response to the power-up pre-signal; and a fuse signal setting unit suitable for providing a fuse signal supplied through a corresponding column selection line to the input terminal of the latch unit in response to the power-up pre-signal and the power-up reference signal.

16. The semiconductor device of claim 15, wherein the second row driving unit provides the second selection voltage to the second row selection lines in response to the power-up post-signal.

17. The semiconductor device of claim 5, further comprising:
- a first redundancy fuse array, which is coupled with a plurality of first redundancy row selection lines and the column selection lines and suitable for outputting, in the boot-up mode, the first fuse signals to the column selection lines in response to a first redundancy selection voltage supplied through the first redundancy row selection lines; and
- a first redundancy row driving unit suitable for supplying a first redundancy selection voltage corresponding to the internal voltage to the first redundancy row selection lines in the boot-up mode.

18. The semiconductor device of claim 5, further comprising:
- a second redundancy fuse array, which is coupled with a plurality of second redundancy row selection lines and part or all of the column selection lines and suitable for outputting, in the power-up mode, the second fuse signals to part or all of the column selection lines in response to a second redundancy selection voltage supplied through a plurality of second redundancy row selection lines; and
- a second redundancy row driving unit suitable for supplying the second redundancy selection voltage corresponding to the external voltage to the second redundancy row selection lines in the power-up mode.

19. A method for driving a semiconductor device having a first and second fuse arrays, which share a plurality of column selection lines, the method comprising:
- in a power-up mode, reading out a plurality of second fuse signals programmed in the second fuse array by using an external voltage simultaneously by a unit of a row through the column selection lines, and latching internal voltage setting signals corresponding to the second fuse signals into a second sense amplification unit;
- generating a predetermined internal voltage in response to the internal voltage setting signals; and
- in a boot-up mode, sequentially reading out a plurality of first fuse signals programmed in the first fuse array by using the internal voltage through the column selection lines, and sequentially storing information signals corresponding to the first fuse signals into a first sense amplification unit.

20. The method of claim 19, wherein the reading out of the second fuse signals includes a process where a plurality of second row selection lines included in the second fuse array are simultaneously activated, and the column selection lines and the first sense amplification unit are electrically blocked.

* * * * *